US009956756B2

(12) United States Patent
Adamson et al.

(10) Patent No.: US 9,956,756 B2
(45) Date of Patent: *May 1, 2018

(54) PRINTING

(71) Applicant: J P IMAGING (WUHAN) LIMITED, Wuhan (CN)

(72) Inventors: John David Adamson, Cumbria (GB); Peter Andrew Reath Bennett, West Yorkshire (GB); Rodney Martin Potts, West Yorkshire (GB)

(73) Assignee: J P Imaging Limited, Cockermouth (GB)

(*) Notice: Subject to any disclaimer, the term of this patent is extended or adjusted under 35 U.S.C. 154(b) by 0 days. days.

This patent is subject to a terminal disclaimer.

(21) Appl. No.: 15/446,876

(22) Filed: Mar. 1, 2017

(65) Prior Publication Data

US 2017/0239934 A1    Aug. 24, 2017

Related U.S. Application Data

(63) Continuation of application No. 13/063,465, filed as application No. PCT/GB2009/051131 on Sep. 7, 2009, now Pat. No. 9,586,392.

(51) Int. Cl.
B41C 1/10    (2006.01)
B41N 1/06    (2006.01)
(Continued)

(52) U.S. Cl.
CPC ............ B41C 1/1041 (2013.01); B41N 1/006 (2013.01); G03F 7/0043 (2013.01);
(Continued)

(58) Field of Classification Search
None
See application file for complete search history.

(56) References Cited

U.S. PATENT DOCUMENTS 4,081,572 A    3/1978    Pacansky
4,833,990 A    5/1989    Hirt et al.
(Continued)

FOREIGN PATENT DOCUMENTS

DE    10021041 A1    11/2001
DE    10058990 A1    7/2002
(Continued)

OTHER PUBLICATIONS

Notice of Allowance and Fee(s) due dated Oct. 5, 2016 in U.S. Appl. No. 13/063,466, filed Apr. 6, 2011, (9 pages).
(Continued)

Primary Examiner — Joshua D Zimmerman
(74) Attorney, Agent, or Firm — Hoffman Warnick LLC

(57) ABSTRACT

A method of preparing a printing form precursor for printing, or a printed circuit board precursor or a semiconductor precursor, the method comprising the step of applying electromagnetic radiation having a pulse duration of not greater than $1 \times 10^{-6}$ seconds, in an imagewise manner, to an imagable surface of the precursor. The imaging process may cause ablation of the coating of the precursor or permit its development in a developer. In each case the imaging radiation needs not be tuned to imaging chemistry (if any) present in the coating. Alternatively the imaging process may induce a change of hydrophilicity or hydrophobicity, or other change of state, of an uncoated substrate.

8 Claims, 1 Drawing Sheet

(51) Int. Cl.
*B41N 1/00* (2006.01)
*G03F 7/004* (2006.01)
*H05K 3/12* (2006.01)
*H05K 3/38* (2006.01)

(52) U.S. Cl.
CPC ........... *H05K 3/1275* (2013.01); *H05K 3/385* (2013.01); *H05K 2203/0315* (2013.01)

(56) References Cited

U.S. PATENT DOCUMENTS

| | | |
|---|---|---|
| 5,454,318 A | 10/1995 | Hirt et al. |
| 5,543,269 A | 8/1996 | Chatterjee et al. |
| 5,555,809 A | 9/1996 | Hirt et al. |
| 5,650,258 A | 7/1997 | Doyle et al. |
| 5,743,188 A | 4/1998 | Ghosh et al. |
| 5,816,161 A | 10/1998 | Nussel et al. |
| 5,836,248 A | 11/1998 | Jarrold et al. |
| 5,836,249 A | 11/1998 | Chatterjee et al. |
| 5,839,369 A | 11/1998 | Chatterjee et al. |
| 5,839,370 A | 11/1998 | Chatterjee et al. |
| 5,843,599 A | 12/1998 | Paz-Pujalt et al. |
| 5,855,173 A | 1/1999 | Chatterjee et al. |
| 5,870,956 A | 2/1999 | Ghosh et al. |
| 5,881,645 A | 3/1999 | Lenney et al. |
| 5,893,328 A | 4/1999 | Ghosh et al. |
| 5,925,496 A | 7/1999 | Ghosh et al. |
| 5,927,207 A | 7/1999 | Ghosh et al. |
| 6,016,750 A | 1/2000 | Nussel et al. |
| 6,082,263 A | 7/2000 | Koguchi et al. |
| 6,105,500 A | 8/2000 | Bhambra et al. |
| 6,125,756 A | 10/2000 | Nussel et al. |
| 6,423,467 B1 | 7/2002 | Kawauchi et al. |
| 6,423,468 B1 | 7/2002 | Hotta et al. |
| 6,482,570 B1 | 11/2002 | Hotta |
| 6,632,584 B1 | 10/2003 | Morgan |
| 6,762,787 B2 | 7/2004 | Beier |
| 6,851,366 B2 | 2/2005 | Gutfleisch et al. |
| 7,157,210 B2 | 1/2007 | Harada et al. |
| 7,259,774 B2 | 8/2007 | Beier |
| 9,586,392 B2 * | 3/2017 | Adamson |
| 2002/0003569 A1 | 1/2002 | Beier |
| 2002/0030733 A1 | 3/2002 | Ressel et al. |
| 2003/0145749 A1 | 8/2003 | Van de Leest |
| 2004/0244620 A1 | 12/2004 | Harada et al. |
| 2005/0287693 A1 | 12/2005 | Ressel et al. |
| 2006/0096473 A1 | 5/2006 | Beisswenger et al. |
| 2006/0201360 A1 | 9/2006 | Andriessen et al. |
| 2006/0238602 A1 | 10/2006 | Fischer |

FOREIGN PATENT DOCUMENTS

| | | |
|---|---|---|
| DE | 10215052 A1 | 10/2002 |
| DE | 10134150 A1 | 1/2003 |
| DE | 10227054 A1 | 12/2003 |
| EP | 0652483 A1 | 5/1995 |
| EP | 0872339 A1 | 10/1998 |
| EP | 0875395 A1 | 11/1998 |
| EP | 1270216 A1 | 1/2003 |
| EP | 1321309 A2 | 6/2003 |
| EP | 1375136 A1 | 1/2004 |
| EP | 1703321 A1 | 9/2006 |
| JP | 2002207199 | 7/2002 |
| JP | 2002337303 | 11/2002 |
| JP | 2004249475 | 9/2004 |
| JP | 2004262189 | 9/2004 |
| WO | 9852769 A1 | 11/1998 |
| WO | 2009059826 A1 | 5/2009 |
| WO | 2010017068 A2 | 2/2010 |

OTHER PUBLICATIONS

Ansari et al. Modification of Aluminum Surface Using Picosecond Laser for Printing Applications (presented at MRS Fall Conference on Dec. 2, 2009) 17 pages.
Final Office Action for U.S. Appl. No. 13/063,466, dated Jul. 18, 2014, 10 pages.
Final Office Action for U.S. Appl. No. 13/063,466, dated Jun. 23, 2015, 12 pages.
Kautek et al. "Physico-chemical aspects of femtosecond-pulse-laser-induced surface nanostructures", Appl. Phys. A 81, 65-70, 2005.
Zimmerman, Office Action Communication for U.S. Appl. No. 13/063,466 dated Nov. 6, 2014, 9 pages.
Yang et al., "Phase transformation at the surface of TiO2 single crystal irradiated by femtosecond laser pulse," 2007, pp. 801-804, Applied Physics A, Materials Science & Processing.
Zimmerman, Office Action Communication for U.S. Appl. No. 13/063,466 dated Dec. 19, 2013, 16 pages.
Patent Cooperation Treaty, PCT International Search Report and Written Opinion of the International Searching Authority for Application No. PCT/GB2009/051131 dated Mar. 25, 2010, 12 pages.
Patent Cooperation Treaty, PCT International Search Report and Written Opinion of the International Searching Authority for Application No. PCT/GB2009/051132 dated Dec. 29, 2009, 9 pages.
Zimmerman, Office Action Communication for U.S. Appl. No. 13/063,465 dated Dec. 20, 2013, 16 pages.
Zimmerman, Office Action Communication for U.S. Appl. No. 13/063,465 dated Aug. 18, 2014, 10 pages.
Zimmerman, Office Action Communication for U.S. Appl. No. 13/063,465 dated Jan. 20, 2015 10 pages.
Zimmerman, Office Action Communication for U.S. Appl. No. 13/063,465 dated Aug. 17, 2015 8 pages.
Zimmerman, Notice of Allowance and Fee(s) Due for U.S. Appl. No. 13/063,465 dated Nov. 28, 2016 17 pages.

* cited by examiner

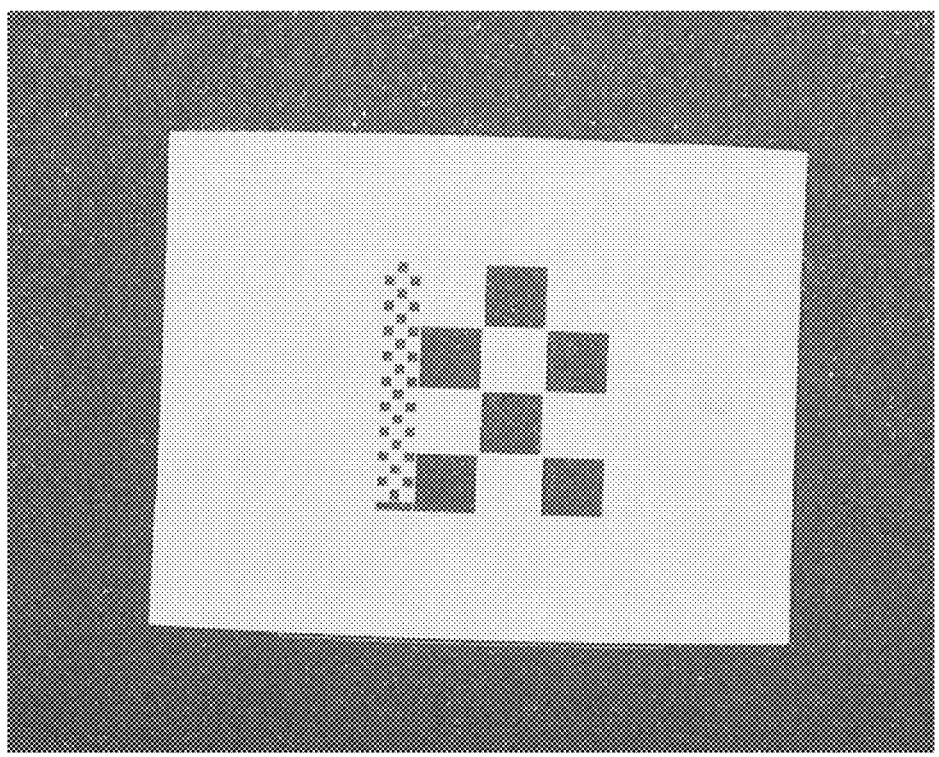

PRINTING

This invention relates to improvements in printing, and in particular to the preparation of substrates, including coated and uncoated substrates, for lithographic printing. It relates in addition to novel lithographic printing surfaces.

Fundamentally, all lithographic printing processes take a printing form precursor which has a specially prepared surface which is uniform throughout; and modifies selected regions of it, leaving reciprocal regions unmodified. Many processes subject the printing form precursor to a chemical developer which acts upon either the modified or unmodified regions, to produce the differentiation needed for printing. Optionally the developed surface is treated to harden the remaining areas of the coating, for example by baking, prior to printing.

It should be noted that in this specification we use the term 'printing form precursor' to denote the initial article having a uniform surface, undifferentiated as regards the acceptance or rejection of ink; and 'printing form' to denote the article now with a differentiated surface which can be printed from. The term printing form herein may be substituted by the term printing plate. The term printing form is preferred in describing and defining the invention because it is of broad connotation. The term printing plate or just plate may nevertheless be used herein for ease of reading.

Printing form precursors having thereon a coating of a chemical composition may be altered in their propensity to be dissolved in a developer solution, by suitable energy. In some compositions the energy renders the areas of the coating subjected to the energy more soluble in the developer. Because of the solubility differential resulting from the imagewise application of energy, on contact with the developer the imaged areas are dissolved away leaving non-imaged areas where the coating remains. Such systems are called positive working systems. The remaining areas of coating are generally oleophilic, and ink-accepting. In the dissolved-away areas the substrate is exposed, and is generally hydrophilic and able to accept the water component of the ink/water fount solution. Thus, printing may be carried out.

In alternative systems it is the areas which have been imagewise subjected to energy which are rendered less soluble than the imaged areas, so that it is the non-imaged areas in which the coating is dissolved away. Such systems are called negative working systems.

In many traditional systems the energy is ultra-violet radiation, of wavelengths approximately in the range 190-400 nm. Many positive working systems sensitive to ultra-violet radiation use quinone diazides moieties present in a polymer composition used as the coating. On exposure to ultra-violet radiation the quinone diazide moieties break down, and in doing so render the composition more soluble in a developer.

In recent years a new positive working technology for printing forms has been developed. This uses infra-red radiation of wavelength in the range 800-1400 nm. In these systems a polymer composition comprises a phenolic resin and a suitable aromatic compound such as a trimethylmethane dye, for example Crystal Violet. By use of infrared lasers, energy is delivered to selected regions of the coating, and the solubility of such regions in a developer is increased.

Also, in recent years, new negative working technologies for printing forms have also been developed. Again these use infra-red radiation of wavelength in the range 800-1400 nm. Examples of these systems include, for example, (i) a polymer composition comprising a novolac resin and a Lewis acid which on exposure to an infrared laser releases acid which crosslinks the novolac resin rendering it insoluble in the developer or (ii) a polymer composition comprising radiation polymerisable oligomers and an initiator which on exposure to an infrared laser generates radicals which bring about polymerisation of the oligomers, rendering the coating insoluble in the developer.

A further alternative negative working system is the ThermoFuse process introduced by Agfa, in which the printing form precursor comprises thermoplastic particles which fuse under laser imaging, and after development form a differential surface.

A further alternative is provided by so-called ablative systems. In ablative systems the energy supplied causes direct damage, or ablation, of the imaged areas of the coating, leading to the required image wise pattern of residual areas of coating and reciprocal exposed areas of substrate, without the need for development. There may need to be a step in which debris is removed, for example by washing. Ablation is another way in which the required imagewise pattern is achieved.

An alternative approach to offset printing is provided by the so-called waterless systems. In waterless systems a fount solution comprising ink and water is not provided. The printing form precursor has a surface which repels ink, typically a surface of silicone rubber, and this obviates the need for water, to occupy regions in which ink is not desired.

The systems described above have in common the fact that the aim is to achieve a pattern of remaining areas of coating, and reciprocal areas in which the coating is removed or damaged.

This may be by removal with developer, or modification by gross physical change such as destructive removal (ablation), to achieve the required differentiation. The intention is always that the ink adheres to only one part of the pattern. Generally, where organic polymeric coatings are provided, this is the remaining areas of the coating, since these are oleophilic and inks too, are generally oleophilic, whilst the substrates are generally aluminium oxide or similar and are generally hydrophilic.

As noted above there have been attempts to develop so-called processless lithographic systems not requiring developer, in which printing forms are imagewise exposed to suitable energy by causing a transition in the imaged areas, without there being areas of residual coating and reciprocal areas of exposed substrate, the former standing as 'islands' in the latter.

There are believed to be in excess of 1000 patents referring to 'processless' offset lithographic printing plates. To some extent at least, the number of patents identified as 'processless', depends upon the definition of 'processless'. For the purpose of the present invention we define a 'processless' plate as a plate which does not require a developer and a processor (required by the vast majority of conventional lithographic plates). The term processless' as used herein therefore includes ablatable plates, "hidden" processing plates (processed on press), direct-to-press plates (both imaged and processed on press or coated, imaged and processed on press), inkjet plates or systems; and switchable or reversible plates (plates in which one condition can be induced; which can then be triggered into, or change over time to another condition, preferably reverting to its original condition).

The processless metal litho printing plate has been a long-term target of the printing industry. The idea of a plate that can be run through a platesetter and mounted directly on the press is attractive: it should be faster (no processing time); it should be cheaper (no processing chemistry to buy); and it should be environmentally superior (no processing chemistry to dispose of). However, from a practical standpoint, it has proved elusive. Available chemical processing technology is excellent, and still dominant.

There have been some proposals in the direction of establishing processless plates. The earliest and so far most widely used technology, is thermal ablation. Here a powerful thermal laser blasts away the coating from the non-image areas of the plate leaving behind an oleophilic surface denoting the image. Ablation, however, requires special equipment to deal with the debris.

So-called 'switchable' polymer plates are seen by several plate manufacturers as the ideal for the future. In these plates, the coating chemistry can be simply 'switched' by digital laser exposure, from hydrophilic to oleophilic (or vice versa). However despite a number of tentative forays into the marketplace, nothing has been commercialised so far, and there are technical issues around the production and imaging of the plates.

In a more advanced form of this hydrophilic/hydrophobic change capability, 'switchable' surfaces have also been described where the 'switching' can, in fact, be reversible—a truly 'switchable' processless system. A number of ceramic-type products have been described, which are claimed to demonstrate this capability.

On-press processing (coating and exposure can be both on- and off-press) is a route to get to processless rather than a technology per se as the technology is not specific and can be, for example, latex coalescence chemistry as discussed earlier, switchable coating chemistry or even photopolymerisation chemistry. To some, on-press processing is not truly processless—as already described, the processing is 'hidden', to others, it appears to offer the 'best of both worlds'.

A fourth approach to processless is inkjet and this is thought to be of future importance but again, to date, a truly processless plate utilising inkjet technology is not available.

A truly processless metal plate (including metal oxide coated metal plate) is not available. Nor is a truly processless polymer or ceramic plate, of practical utility.

An effective processless lithographic system would clearly be highly desirable. A processless lithographic system which could act upon a surface non-catastrophically, and switch it from being ink-accepting to ink-repelling, or vice versa, would be of high value. It would be particularly valuable if the system would allow a printing form which had undergone a transition of this nature, to be restored to its original form, and re-used. The printing industry is a vast industry and the environmental implications of the current approach of using a printing plate and scrapping it, or using it and recycling it, still at a heavy environmental cost, are enormous.

BRIEF DESCRIPTION OF THE DRAWINGS

FIG. 1 shows a photograph of a print prepared according to an embodiment of the invention.

In accordance with a first aspect of the present invention there is provided a method of preparing a printing form precursor for printing, the method comprising the step of applying electromagnetic radiation having a pulse duration of not greater than $1 \times 10^{-6}$ seconds, in an imagewise manner, to an imagable surface of the printing form precursor.

The term printing form herein may be substituted by the term printing plate. The term printing form is preferred in defining and claiming in the invention because it is of broad connotation. The term printing plate or just plate may nevertheless be used herein for ease of reading.

In accordance with a second aspect of the present invention there is provided the use, for the purpose of converting a printing form precursor into a printing form having a differentiated image surface such that portions accept a printing ink and portions do not, of an imaging device which provides pulses of electromagnetic radiation of duration not greater than $1 \times 10^{-6}$ seconds.

In accordance with a third aspect of the present invention there is provided a printing form having an imagable surface subjected to pulses of electromagnetic radiation of duration not greater than $1 \times 10^{-6}$ seconds with the result that selected portions are ink-accepting and the reciprocal portions are not ink-accepting.

Preferably the surface is a substantially uniform surface.

The imaging energy may suitably be visible, ultra-violet or infra-red radiation.

Preferably the imaging energy is delivered by an ultra-short pulse or ultra-fast laser. Preferably the laser emits suitable pulses as such (i.e. is a dedicated pulse generator); preferably it is not a continuous wave laser whose output is modulated post-emission to form "pulses". Preferably it is not a continuous wave (CW) laser whose output is modulated by electronic control of the laser power source. In such cases the power delivered by the "pulse" is no different, or not substantially different, from the power delivered by the non-modulated continuous wave output. In contrast it is preferred that the present invention uses pulses of intense power.

Suitable lasers for use in this invention may operate by Q switching, in which energy is built up to be released as pulses in avalanche events; mode locking, which uses optical interference to produce pulse-shaped "beats" of light; Cavity Dumping, in which a "door" is opened periodically to "dump" a burst of light; and Gain Switching, in which pulses are formed by quickly switching the optical gain in the laser medium used to generate the laser light.

Preferably the pulses are of duration not greater than $5 \times 10^{-7}$ seconds, preferably not greater than $1 \times 10^{-7}$, preferably not greater than $5 \times 10^{-8}$, preferably not greater than $1 \times 10^{-8}$ seconds, preferably not greater than $5 \times 10^{-9}$ seconds, preferably not greater than $1 \times 10^{-9}$ seconds, preferably not greater than $5 \times 10^{-10}$ seconds, preferably not greater than $1 \times 10^{-10}$ seconds, preferably not greater than $5 \times 10^{-11}$ seconds, preferably not greater than $1 \times 10^{-11}$ seconds. In some embodiments they may be of duration not greater than $5 \times 10^{-12}$ seconds, preferably not greater than $1 \times 10^{-12}$ seconds, preferably not greater than $1 \times 10^{-13}$ seconds.

Preferably the pulses of electromagnetic radiation, preferably from an ultra-short pulse or ultra-fast laser, are of duration at least $1 \times 10^{-18}$ seconds, preferably at least $1 \times 10^{-16}$ seconds, preferably at least $1 \times 10^{-15}$ seconds, preferably at least $5 \times 10^{-15}$ seconds, preferably at least $1 \times 10^{-14}$ seconds, preferably at least $5 \times 10^{-14}$ seconds, preferably at least $1 \times 10^{-13}$ seconds. In some embodiments they may be of duration at least $5 \times 10^{-13}$ seconds, preferably at least $1 \times 10^{-12}$ seconds, preferably at least $5 \times 10^{-12}$ seconds.

The pulses could be produced by a generator working at a fixed frequency, or in a region around a fixed frequency. Alternatively the pulses may be generated by a signal derived from the plate processing apparatus. Such a signal could typically have a small variation in frequency, or may have a large range in frequency, possibly starting from 0 Hz. In all these cases there can be identified an average frequency of pulsing that would occur over the processing of a whole plate, and possibly a maximum frequency that may depend on the specification of the electromagnetic source or the specification of the plate exposure apparatus (platesetter). The average processing frequency is an important parameter of the production rate of the plate exposure apparatus (platesetter—as later described in more detail).

The average frequency of pulsing is preferably at least 100 pulses per second (100 Hz). Preferably it is at least 1000 pulses per second (1 kHz), preferably at least $10^4$ pulses per second (10 kHz), preferably at least $10^5$ pulses per second (100 kHz), and preferably at least $10^6$ pulses per second (1 MHz). In certain embodiments it could be higher, for example at least $10^7$ pulses per second (10 MHz), or at least $5 \times 10^7$ pulses per second. These repetition rates are in the range 0.0001 MHz to 50 MHz, or higher, and might be expected to lead to plate production speeds, e.g. within a platesetter, of up to approximately 45 plates per hour.

The delivery of the electromagnetic radiation may be even over time but this is not an essential feature of the invention. If the delivery of electromagnetic radiation varies over time, for example using a frequency sweep, definitions of parameters such as pulse duration and pulse separation given herein are to be taken as average values.

A convenient measure of the energy requirement of the process for forming a process plate is to determine the energy density (energy per unit area) required to achieve the necessary changes in the plate surface. Where the electromagnetic energy is delivered continuously (continuous wave) at a Power, P(Watts) into a defined spot of diameter D (cm) (or for a non circular spot, some measure of the linear extent of that spot, e.g. the side length of a square spot) then the Power Density, i.e. Watts per unit area, is the Power divided by the spot area. It is common practice to ignore any numerical scaling factor for similar spot shapes, i.e. for a circular spot it is common to divide the power by the square of the diameter, $P/D^2$. To get the energy density it is necessary to estimate the time that the spot is exposed for. A simple estimate of this is to take the time that the beam takes to traverse the spot, i.e. the spot diameter divided by the traverse speed, v (cm/s) of the electromagnetic beam. This is D/v. The energy density is the power density multiplied by the exposure time, which is given by the formula P/Dv ($J/cm^2$). This definition for the energy density is commonly referred to as the "Specific Energy" of a continuous wave process.

However this invention uses pulsed radiation. For a pulsed electromagnetic beam the situation is more complicated. The simplest analysis is when each pulse of the source exposes a unique and previously unexposed spot on the surface. Furthermore if the beam is stationary at the arrival and throughout the duration of the pulse, then the energy density can be simply calculated. The beam power during the pulse can be estimated as the energy of the pulse, E (J), divided by the pulse length (s). The Power density is defined as this power divided by the spot area as discussed previously. However the exposure time is now solely the length of the pulse (s) and so the energy density becomes simply the pulse energy divided by the spot area, $E/D^2$. This energy density is commonly referred to as "Fluence" in the literature.

Normally it is not desirable to stop the beam movement to deliver pulses as this introduces delays and does not optimise the throughput of the process. Thus the beam traverses the surface during the extent of the pulse. This can be regarded as elongating the spot in the direction of beam travel by an extent given by multiplying the traverse speed v by the pulse length t, with the spot area now being defined as $D(D+\tau v)$. The formula for fluence, F, becomes:

$$F = E/(D(D+\tau v)) = E/D^2(1+\tau v/D)$$

If $\tau v/D \ll 1$ then the effect of traverse speed can be ignored. For a spot size of 20 µm travelling at 1 $ms^{-1}$ and a pulse length of 10 pS then $\tau v/D = 5 \times 10^{-7}$ so the effect of travel speed on the fluence can be safely ignored.

Another factor is related to pulse overlap. If the speed is sufficiently high for a given frequency then the individual pulses do not overlap on the surface of the material. For this to happen then it is simple to show that $fD/v < 1$, where f is the repetition frequency of the pulsed electromagnetic source. When the traverse speed is such that the pulses are not spatially separated then the effect of overlapping pulses on the material surface may have to be considered. It is common in the literature of short pulsed laser processing to refer to the effect of overlapping pulses as "incubation" and to measure the degree of incubation by estimating the number of overlapping pulses, N, as $N = fD/v$. N is sometimes referred to as the incubation number or incubation factor and does not need to be an integer. If $N < 1$ there is no overlap of pulses. When $N = 1$ (which is preferred) the exposure spots of successive pulses are touching, and as N increases there is increasing overlap of spots. For low values of N, say $N < 5$, there may be little influence on incubation. However at high values of N a process may be regarded as a "quasi CW" process, and the energy density may be better expressed in terms of "Specific Energy".

Finally after a substantial area of, or the whole of, a plate has been exposed then an additional pass, or passes may be made. These additional passes may increase or add to the material changes created by previous passes.

The present invention preferably employs a low value of N; thus "fluence", in $mJ/cm^2$, is regarded as the most appropriate definition of energy density, for use in this invention.

Preferably the fluence in the method of the present invention is at least 1 $mJ/cm^2$, preferably at least 50 $mJ/cm^2$, for example at least 100 $mJ/cm^2$.

Preferably the fluence in the method of the present invention is not greater than 20,000 $mJ/cm^2$, preferably not greater than 10,000 $mJ/cm^2$, preferably not greater than 5,000 $mJ/cm^2$, preferably not greater than 2,000 $mJ/cm^2$, preferably not greater than 1,000 $mJ/cm^2$, preferably not greater than 500 $mJ/cm^2$, preferably not greater than 200 $mJ/cm^2$. It may be not greater than 100 $mJ/cm^2$, and in some embodiments not greater than 50 $mJ/cm^2$.

Preferably the pulse energy delivered in this method is at least 0.1 µJ, preferably at least 0.5 µJ, and preferably at least 1 µJ.

Preferably the pulse energy delivered in this method is up to 50 µJ, preferably up to 20 µJ, preferably up to 10 µJ, and preferably up to 5 µJ.

Preferably a region to be imaged in the method is subjected to one pass or traverse only, of the beam of electromagnetic imaging radiation. However in other embodiments a plurality of passes may be employed, for example up to 10, suitably up to 5, for example 2. In such embodiments the first pulse has a pulse energy as defined above. Subsequent pulse(s) may have a pulse energy as defined above but this need not be the same pulse energy as the first pulse, or any other pulses; for example it may advantageously be less.

When multipass laser imaging is employed, it is intended that passes are made without significant delay between them and without treatments being applied between them (other than, if necessary, debris removal). It is desirable that any such treatments are carried out without removal of the plate from the platesetter. Preferably, however, no such treatments are required and the multipass imaging process is carried out in one stage (as opposed, for example, to two stages separated by a dwell time).

Preferably the method of the invention does not cause ablation; or, if it does, causes only insubstantial ablation; for example ablation at a level which does not require removal of debris.

The pulse may generate a spot or pixel of any shape, for example circular, oval and rectangular, including square. Rectangular is preferred, as being able to provide full imaging of desired regions, without overlapping and/or missed regions.

Preferably the pulsed radiation is applied to an area of less than $1 \times 10^{-4}$ cm$^2$ (e.g. a 113 µm diameter circle), preferably less than $5 \times 10^{-5}$ cm$^2$ (e.g. a 80 µm diameter circle), preferably less than $1 \times 10^{-5}$ cm$^2$ (e.g. a 35 µm diameter circle).

Preferably the pulsed radiation is applied to an area preferably greater than $1 \times 10^{-7}$ cm$^2$ (e.g. a 3.5 µm diameter circle), preferably greater than $5 \times 10^{-7}$ cm$^2$ (e.g. a 8 µm diameter circle), preferably greater than $1 \times 10^{-6}$ cm$^2$ (e.g. a 11 µm diameter circle).

The natural profile of a laser beam, by which is suitably meant the energy or intensity, is Gaussian; however other beam profiles are equally suitable to carry out the change described herein, especially laser beams with a square or rectangular profile (i.e. energy or intensity across the laser beam). The cross-sectional profile of the laser beam may be circular, elliptical, square or rectangular and preferably the intensity of the laser beam energy (or "profile" of the laser beam) is substantially uniform across the whole area of the cross-section.

Preferably the method employs, as the imaging device, a laser providing such pulses, for example a nanosecond, picosecond or femtosecond laser. Such lasers provide pulses of high intensity; they are not adapted or gated CW lasers. Alternatively the method may employ, as the imaging device, a nanosecond laser fitted with a device, such as a Q-switch, to release intense pulses of laser energy "stored" during dwell times (in which the laser was still pumped but not releasing the photon energy produced).

One imaging tool preferred for use in the present invention is a femtosecond laser, for example emitting pulses of pulse duration in the range 50-400, for example 100-250, femtoseconds (fs).

Another imaging tool preferred for use in the present invention is a picosecond laser, for example emitting pulses of pulse duration in the range 1-50, for example 5-20, picoseconds (ps).

In non-ablative embodiments of the invention the imaging energy preferably does not produce substantial heat at the impinged-upon surface.

Ultra-fast fibre lasers may be used, in which a chemically treated ("doped") optical fibre forms the laser cavity. This optical fibre is "pumped" by laser diodes, and there are several proprietary technologies used to couple the pumped light from the laser diodes into the optical fibre. Such lasers have relatively few optical components and are inexpensive, efficient, compact and rugged. They are thus considered to be especially suitable for use in this invention. However other ultra-short pulse or ultra-fast lasers may be used.

The imaging device may be a platesetter. To get a laser to expose a plate the laser, the plate, or both have to move so that the whole plate surface can be addressed—the process called rastering. The arrangement of the laser within a platesetter (frequently referred to as the 'architecture') can be accomplished in one of three basic ways. Each of these architectures may be used in the present invention, and has its own performance differences, advantages and disadvantages. In the Flat Bed architecture, the plate is mounted flat on a table and the laser scans across, then the table moves down by one pixel and the laser scans back again. In the Internal Drum architecture the plate is fixed into a shell and the imaging laser rotates at high speed in the centre of the drum (in most but not all internal drum setters the plate remains still and the laser moves laterally as well as longitudinally). In the third architecture, External Drum the plate is clamped onto the outside of a cylinder, and the laser (or quite commonly a number of, for example, laser diodes) is mounted on a bar; usually the cylinder rotates and the laser(s) track across the plate.

The printing form precursor may, in some embodiments, be exposed on a printing press.

A method which involves transferring the printing form precursor between an imaging device and a printing press may require a printing form precursor which can be reconfigured between a flat shape (when on the imaging device) and a cylindrical shape (when on the printing press). Such a printing form precursor requires flexibility. Certain of the printing form precursors described above are sufficiently flexible to be reconfigured between flat and cylindrical forms several times, without distortion in its shape or damage to the printing surface. One example is a printing form precursor having a plastics base layer, for example having a polyester layer, for example of average thickness in the range 25 to 250 µm, preferably 100 to 150 µm, and an aluminium oxide layer, for example of average thickness as described above, and optionally carrying an image layer of a polymeric material of thickness in the range 0.5 to 5 µm. Between the polyester layer and the aluminium oxide layer there may advantageously be an aluminium layer of average thickness in the range 10 to 50 µm, preferably 20 to 30 µm. Non-metallic (and metallic) substrates having metal oxide layers, or able to carry metal oxide layers, are described in U.S. Pat. No. 5,881,645, U.S. Pat. No. 6,105,500 and WO 98/52769 and they and variations thereof may provide flexible and non-brittle printing form precursors of utility in the present invention.

The printing form precursor may be a flat plate, a plate with a curved surface, for example a roller, e.g. for use on a printing press, or cylinder or sleeve for a cylinder, in each case, suitable for use on a printing press.

The substrate may be a metal sheet provided with a metal compound (for example a metal oxide or sulphide printing surface. The latter is preferably different from that which would be achieved by oxidation or sulphidation under ambient conditions). For example when the process of producing the substrate employs, for example anodisation, it may produce a metal oxide printing surface which is thicker and/or more durable than would otherwise be the case.

A metal substrate may be both grained and anodised, for example electrochemically grained, and electrochemically anodised.

Preferably a said metal compound has an average thickness in the range 0.05 to 20 gsm (grams per square meter), preferably 0.1 to 10 gsm, preferably 0.2 to 6 gsm, preferably 1 to 4 gsm.

The printing surface may preferably be aluminium oxide or titanium oxide.

The printing form may preferably comprise an aluminium or titanium substrate, on which the respective aluminium oxide or titanium oxide printing surface is disposed.

The printing form precursor may be a plastics or plastics-containing sheet (preferably a polyester sheet or a fibre-reinforced plastics sheet, for example glass reinforced plastics (GRP), for example glass-reinforced epoxy resin sheet) onto which the metal compound is applied. This could be by a vapour deposition or sputtering method, by corona discharge, or by any anodising process. To achieve this by anodising the printing surface precursor requires a conductive layer. Conductive polymers are available but in a preferred method a metal layer is applied to the sheet, for example by vapour deposition, by casting, by solution deposition or by lamination. Reference is made to the laminates of aluminium and plastics described in U.S. Pat. No. 5,650,258 for more information as to how to provide such laminates. Whilst such laminates are of interest in the methods of the present invention no claim is made to any such laminates per se. Alternatively the substrate may be steel sheet of a grade and thickness such that it can be bent and flattened multiple times, without cracking or adopting an undesired permanent shape.

A metal substrate may optionally be coated with a protective surface to prevent chemical attack during the precursor manufacture or on the press from any pressroom product which the printing form may contact.

Another suitable substrate, described in WO 2009/059826, may be an aluminium alloy core clad with different aluminium alloy to provide a composite product having good strength, and formability.

One preferred plastics-containing laminate for use in this invention is a polyester/metal oxide laminate, for example a polyester/aluminium/aluminium oxide laminate.

An especially preferred plastics-containing substrate for use in this invention is an epoxy-glass fibreboard (e.g. of the type used as the carrier for copper layers in printed circuit board (PCB) laminates known as FR4). Such materials have a high Young's modulus, for example approximately 25 GPa, much higher than many other plastics sheet materials and within the same order of magnitude as aluminium (whose Young's modulus is 69 GPa).

A preferred metal oxide layer used in this invention may be anodised and subjected to a post-anodic treatment (PAT). Suitable post-anodic treatments include treatments by, for example, poly(vinylphosphonic acid), inorganic phosphates and fluoride-containing materials such as sodium fluoride and potassium hexafluorozirconate. However embodiments in which the substrate is not subjected to a post-anodic treatment are not excluded.

Any polymeric coating on a printing form precursor of this invention is preferably of thickness in the range 0.5 to 5 µm.

In first embodiments the imagable surface of the printing form precursor has a surface, and the surface is modified by the incident pulsed radiation so as to alter its ink-accepting property. It may be altered to become ink-accepting (reciprocal areas, non-imaged, being non-ink-accepting). Alternatively it may be altered to be non-ink-accepting (the reciprocal areas, non-imaged, being ink-accepting). Preferably in this embodiment no development is needed. The surface may be of a coating on a substrate or the substrate surface itself.

In these first embodiments, the surface may be an inorganic surface, for example a metal compound.

The metal compound may suitably be a metal sulphide or, preferably, a metal oxide.

The metal may suitably be a metal having an atomic number from 12 to 83 inclusive, preferably 12 to 74 inclusive, preferably 12 to 48 inclusive, and preferably from 13 to 30 inclusive.

The metal may suitably be selected from Group Nos. 3 to 13 of the periodic table. More preferably it may be aluminium or a transition metal selected from the first row of transition metals in the periodic table (i.e. atomic numbers 21 to 30 inclusive).

Preferred metals satisfy definitions of both of the preceding paragraphs.

The metal compound may be a layer which forms naturally on a metal substrate under ambient conditions; for example an oxide layer on aluminium, titanium, chromium, copper, zinc, stainless steel or brass, or a silver sulphide layer on silver. Alternatively or additionally it may be provided, or built up, by a preparatory step of anodising, for example electrochemically anodising, or by corona discharge. A metal oxide can be provided on a metal substrate, e.g. of the same metal species as the substrate (e.g. Al/Al$_2$O$_3$) or as the oxide of an alloying element, e.g. chromium oxide on stainless steel or zinc oxide on brass. Alternatively it can be provided on a non-metal substrate (for example a plastics sheet), as will be later described.

It may be a metal compound which forms naturally on the metal surface, for example an oxide, as in the case of aluminium oxide and titanium oxide; or a sulphide, as in the case of silver sulphide.

A metal oxide surface may be provided, or built up, by a preparatory step of anodising. Of particular interest are anodised aluminium and anodised titanium precursors, preferably having oxide layers enhanced by an anodising process.

In such embodiments the modification of the surface may be to render it more hydrophilic, or less hydrophilic. For example a hydrophobic surface may be rendered hydrophilic; or a hydrophilic surface may be rendered hydrophobic. The assessment of the change which a surface has undergone is easily determined by examining the wetting of the surface by water. Water readily wets a hydrophilic surface, but forms beads on a hydrophobic surface. The contact angle of the water to the surface may be measured to give a quantitative value.

In the present invention the imaging, as defined, preferably decreases the contact angle; that is, the surface is preferably rendered more hydrophilic.

It has been found in the present invention that oxide-coated substrates, imaged in accordance with the present invention, experience a decrease in their contact angle. It is expected, generally, that oxide-containing inorganic materials, having metal-oxide bonds M-O, or Si—O bonds will show similar properties. Accordingly useful properties on ceramic substrates may be expected.

However there may be certain embodiments in which the imaging method renders the surface more hydrophobic, and such embodiments are not excluded.

In such first embodiments of the present invention the modification described may reverse, or may be reversed, for example by delivery of a suitable heat or electromagnetic radiation. In preferred embodiments it self-reverses, over time, for example within 24 hours. A reversing means to effect such a reversal may be employed when the modification would not self-reverse; or when it would self-reverse, but more slowly than is desired.

"Reversal" means that the differentiation caused by the imaging of the present invention substantially disappears, so that what was recently the "printing form" has of itself now become, once again, a "printing form precursor", so that it can be used again. Anodised aluminium printing forms and anodised titanium printing forms are preferred substrates exhibiting this phenomenon.

In second embodiments of the present invention the printing form precursor has a coating, and the coating is modified by the incident pulsed radiation so as to alter its solubility in a developer. It may be altered so as to be preferentially removed by a developer, and expose ink-accepting regions. It may be altered to be preferentially removed by a developer, and expose non-ink-accepting regions. It may be altered to become preferentially resistant to dissolution by a developer, so that, instead, non-imaged areas are exposed, and are preferentially ink-accepting. It may be altered to become preferentially resistant to dissolution by a developer, so that non-imaged areas are exposed, and are preferentially non-ink-accepting.

Preferably such embodiments have a substrate or support on which the coating is applied, the substrate or support having an inorganic surface, preferably a metal oxide. Especially preferred substrates are metal oxide/metal substrates, in which the metal oxide forms naturally on the metal surface, as in the case of aluminium oxide and titanium oxide. Alternatively or additionally it may be provided, or increased, by a chemical or electrochemical treatment; for example by anodising. Of particular interest are aluminium and anodised titanium precursors having oxide layers enhanced by an anodising process.

Here the difference from the first embodiment is that chemical development is needed. Although this is a further step, and although the printing form cannot be re-used (at least not without a re-coating process), there may still be advantages over other processes in terms of accuracy, precision and energy cost.

The coating may conventionally contain chemical components which are in some manner changed by electromagnetic radiation at or close to a certain wavelength, (for example 388 nm, or 1064 nm). For ease of reading we use the term "imaging chemistry" herein to denote such components, and/or coatings containing such components. It has been found that the method of the invention can cause a useful change in a coating (for example producing ablation or a change in solubility in a developer) even when the imaging conditions are very different from those for which the coating was intended. In effect the method of the invention appears to override the "imaging chemistry" in the coating. This is important because it suggests that conventional coated printing plates could be imaged using the method of the present invention. With the imaging chemistry present in the coating, the printer could choose to use conventional imaging utilising the imaging chemistry, or to use the imaging method of the present invention;

a printing plate could be produced with a coating free of imaging chemistry.

In third embodiments the printing form precursor has a coating which is directly disrupted or ablated by the incident pulsed radiation. Preferably the pulsed radiation effects the ablation-like removal of imaged portions of the coating.

In fourth embodiments the surface is of a plastics material. The surface of the plastics material may be directly "written" by the pulsed radiation. Preferred polymers are thermoplastics materials. Suitable plastics materials include polyolefins, for example polyethylene and polypropylene, acrylic polymers, for example polymethylmethacrylate, polycarbonates, polyamides, polyoxyethylene polymers and polyesters.

In fifth embodiments the surface is of a semiconductor material.

In sixth embodiments the surface is of a glass, or a ceramic, or a glass-ceramic.

In seventh embodiments the surface is of a metal, including metal/metal oxide.

In eighth embodiments the surface is a compound between a metal and at least one other element. The compound is preferably carried by the same metal. The compound may, for example, be a metal oxide (discussed above), sulphide, carbide or nitride. It may suitably be a thin surface layer or film.

In accordance with the present invention the pulsed radiation may directly disrupt (i.e. without the agency of a developer) or ablate a suitable surface, preferably having a coating, directly, and produce a change in surface topography which may be exploited in printing. More preferably, however, such a method is not carried out to the point where ablation is achieved. Preferably, the surface is modified non-catastrophically.

Examples of non-catastrophic modification may include changes in hydrophilic/hydrophobic nature; changes in crystal structure; changes in oxidation state; changes in excitation state; changes in energy levels; changes in surface energy; changes in state; and changes in amorphous/crystalline/semi-crystalline liquid crystalline character.

As noted above, suitable methods may be reversible. The change in character of the surface or coating induced by the pulsed radiation may be removed by an overall energy density supplied to the surface—for example by overall heating or by an overall exposure to electromagnetic radiation, or by laser-scanning using a raster pattern traced over the entire surface; or by contacting the surface or coating with an appropriate liquid; or it may occur naturally, without any intervention.

Embodiments of the invention may be positive working or negative working.

Preferred methods of the present invention do not achieve photopolymerization, in the irradiated regions.

There are many disclosures in the literature of "switchable" surfaces, the "switching" being induced by imaging methods different from the imaging method of the present invention, which utilises ultra-fast radiation (e.g. from femtosecond or picosecond lasers). Potentially any such "switchable" surface is a surface that may be "switched" by the method of this invention. Therefore for the purpose of providing further information about potentially useful substrates and surfaces the following information is given.

'Switchable' Polymers

A number of examples of "switchable" polymers have been described as valuable in lithographic plate compositions over the years; the following may be cited as examples of "switchable polymers".

1. In U.S. Pat. No. 4,081,572 Xerox describe hydrophilic carboxylated polymers which may be cyclodehydrated by thermal exposure to provide hydrophobic images. The printing masters are said to be press-ready after exposure as they are hydrophobic in the image areas and hydrophilic in the background areas. As an example, the chemistry can be represented by the following schematic:

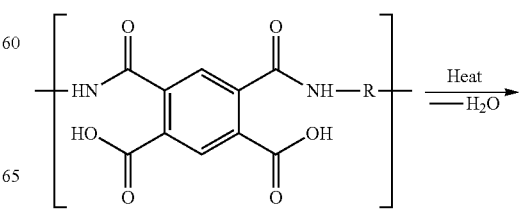

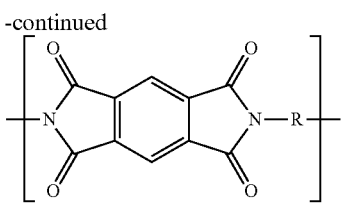

2. In EP 652483A 3M describe a positive working, thermally sensitive polymer comprising a copolymer of 90 mol % of tetrahydropyranyl methacrylate 15 and 10 mol % of methacryloxypropyltrimethoxysilane which is rendered hydrophilic on exposure. Wet processing is not required and expensive surface treatments that are given to conventional lithographic supports are not required—the inference being that the switched polymer is sufficiently hydrophilic to be the background (non-image) printing surface. Conventional presses and fountain solutions can be used. On exposure, a hydrophilic polycarboxylate polymer is generated, as indicated below.

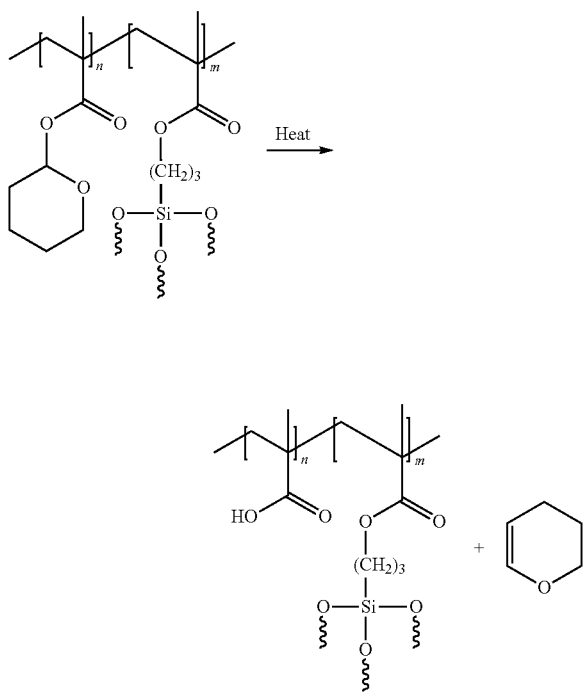

3. In U.S. Pat. No. 6,632,584 Creo describe a 'switchable' polymer consumable which may comprise a water soluble polymer, a salt of a fatty acid and an ir absorber. The composition which is capable of switching from a hydrophilic state to a hydrophobic state when heated, preferably by a focussed ir laser. The negative working composition changes from a more water soluble form to a less soluble composition when heated. The degree of solubility and the degree of hydrophilic activity can be controlled over a wide range by mixing the composition with different polymers. The 'switchable' coatings may be coated directly on to press cylinders, imaged on press and printed without chemical development. After printing, residual coating can be removed, the press cylinder recoated and the entire exercise repeated.

However such disclosures, in general, are not attractive with the imaging and processing methods described in the cited documents.

'Switchable Surfaces'

'Switchable surfaces' is an alternative approach to truly processless plates and one which would give the additional advantage of a capability to re-use, an aluminium or titanium substrate. In this approach, the same lithographic substrate (or, incidentally, a press cylinder), is used in a plurality of press runs or print cycles. Several methods have been disclosed in the prior art which enable the erasure of the lithographic image from the substrate and then reuse of the substrate in the next cycle of imaging and printing. In the ideal configuration, the printing plate becomes truly 'reversible'.

Kodak too has explored the use of ceramic surfaces to produce processless and 'reusable' plates. In U.S. Pat. No. 5,743,188, for example, Kodak describes the use of a lithographic plate which has a zirconia ($ZrO_2$) ceramic surface. Exposure to radiation transforms the surface from hydrophilic to oleophilic or from oleophilic to hydrophilic (dependent upon the circumstances). The zirconia ceramic plate is said to be capable of long runs and can be reused by erasing the image from the ceramic surface by thermally activated oxidation or by laser assisted oxidation. Follow-up U.S. Pat. No. 5,855,173 describes ceramics which are alloys of $ZrO_2$ and a second oxide chosen from MgO, CaO, $Y_2O_3$ and $Sc_2O_3$.

Some further insight into the potential importance of ceramic technology may be provided by Agfa in US2003/0145749, where a truly reversible method for producing a printing form, is described. According to the '749 patent application, oxygen vacancies are introduced into a ceramic oxide or oxidic ceramic (such as alumina, zirconia or anodised aluminium—preferred α-alumina) by either exposure to ultra-violet radiation between 200 and 400 nm or by heating under low partial oxygen pressure or in a reducing atmosphere. These steps require impractical conditions of exposure in terms of at least one of time, temperature and atmosphere.

In EP 1,375,136 Heidelberger Druckmaschinen (HDM) describes the concept of a reusable printing form which comprises a printing area having a metal oxide surface which is coated with an amphiphilic organic compound having an acidic polar character. By appropriate application of energy, the surface can be imaged, erased and re-used.

Despite intensive R&D efforts from both the plate manufacturers and the press manufacturers, none of these inventions has been reduced to practice; exposure times and/or energies and/or temperatures may be too extreme to be of commercial value. It is envisaged that at least some of the difficulties holding them back could be overcome when the method of the present invention is employed (especially in preferred embodiments which have a metal and/or metal oxide substrate, having a coating or being uncoated).

The present invention has been described, up to this point, in terms of printing technology. However there is no technical reason why the same imaging methods could not be used in the manufacture of printed circuit boards, or in the processing of semi-conductors, in which the imagewise modification of a coated surface on the printed circuit board or semi-conductor is a desired step. Thus a printed circuit board could be manufactured by laying a coating onto a metal surface, imaging the coating using the pulse imaging method described herein, subjecting the imaged surface to a chemical developer if needed (i.e. if the imaging step itself was not an ablation step), thereby exposing selected regions of a metallic surface, and then subjecting the surface to an etching solution, so that exposed metallic regions are removed. In the case of a semi-conductor surface a coating thereon (often called a photoresist) may be imagewise removed to expose selected regions of the semi-conductor surface, which can then be treated with a desired chemical treatment solution or other doping agent, or etched as required.

In accordance with a further aspect of the present invention there is provided a method of modifying a coated surface of a printed circuit board or semi-conductor precursor during its manufacture, the method comprising the step of applying electromagnetic radiation having a pulse duration of not greater than $1\times10^{-6}$ seconds, in an imagewise manner, to the coated surface.

In accordance with a further aspect of the present invention there is provided the use, for the purpose of modifying a coating on a printed circuit board or semi-conductor precursor so that it becomes differentiated, of an imaging device which provides pulses of electromagnetic radiation of duration not greater than $1\times10^{-6}$ seconds.

In accordance with a further aspect of the present invention there is provided a printed circuit board or semi-conductor precursor having an imagable coating subjected to pulses of electromagnetic radiation of duration not greater than $1\times10^{-6}$ seconds, with the result that the surface has areas of remaining coating and areas without coating.

Preferred features of the aspects of the invention stated above for coated printing forms and printing form precursors, apply to these further aspects, which relate to PCB and semi-conductor precursors.

The invention will now be further described, by way of example, with reference to the following.

EXAMPLE SET 1

In this set of experiments a range of commercially available printing plates were exposed to ultra-fast (u-f) laser radiation, and the threshold energy density (fluence) requirements for a) development and b) ablation were recorded.

The printing plates were both analogue (conventional) and CtP (Computer to Plate, digital) commercial lithographic printing plates. Both the analogue plates (Fuji FPSE, Kodak New Capricorn) and the CtP plates (Agfa Amigo, and Rekoda Thermax) were exposed using a Clark ultra-fast laser operating under the following conditions: frequency of 1 kHz, 50 μm spot size and pulse width of 240 femtoseconds (fs), and either 388 nm or 775 nm wavelength. The Agfa Amigo and the Fuji FPSE plates were also exposed using a Fianium laser, frequency of 500 kHz, 30 μm spot size, pulse width of 10 picoseconds (ps), and 1064 nm wavelength. Development (when required) employed the developer recommended for the particular plate, under the standard conditions. Plate assessment used standard techniques well known to persons skilled in the art.

The results are set out in Tables 1 to 3 below.

TABLE 1

1. Clark femtosecond laser, 388 nm, 240 fs, 50 μm spot size, 1 KHz:

| Plate | Threshold for | Energy μJ (per pulse) | Track speed mm/sec | Energy Density (fluence) mJ/cm$^2$ |
|---|---|---|---|---|
| Agfa Amigo | Development | 2 | 20 | 102 |
| | Ablation | 3.5 | 10 | 178 |

TABLE 1-continued

1. Clark femtosecond laser, 388 nm, 240 fs, 50 μm spot size, 1 KHz:

| Plate | Threshold for | Energy μJ (per pulse) | Track speed mm/sec | Energy Density (fluence) mJ/cm$^2$ |
|---|---|---|---|---|
| Rekoda Thermax | Development | 1 | 10 | 51 |
| | Ablation | 2 | 15 | 102 |
| Fuji FPSE | Development | 1.27 | 20 | 65 |
| | Ablation | 4.45 | 20 | 227 |
| New Capricorn | Development | 1.27 | 15 | 65 |
| | Ablation | No ablation up to 4.45 | 2 | 227 |

TABLE 2

2. Clark femtosecond laser, 775 nm, 240 fs, 50 μm spot size, 1 KHz:

| Plate | Threshold for | Energy μJ per pulse | Track speed mm/sec | Energy Density (fluence) mJ/cm$^2$ |
|---|---|---|---|---|
| Agfa Amigo | Development | 3.1 | 10 | 158 |
| | Ablation | No ablation up to 5.5 | 10 | 280 |
| Rekoda Thermax | Development | 1.5 | 20 | 76 |
| | Ablation | 3.1 | 10 | 158 |
| Fuji FPSE | Development | 3.5 | 20 | 178 |
| | Ablation | 5 | 100 | 255 |
| New Capricorn | Development | 1.27 | 15 | 65 |
| | Ablation | 4.45 | 2 | 227 |

TABLE 3

3. Fianium Laser 1064 nm, 10 picosec, 30 μm spot size:
Threshold for development:

| Plate | Energy μJ (per pulse) | Track speed mm/sec | Hz | Energy Density (fluence) mJ/cm$^2$ |
|---|---|---|---|---|
| Agfa Thermal | 1.9 | 200 | 500K | 269 |
| | 0.24 | 50 | 20M | 34 |
| Fuji FPSE | 2.9 | 100 | 500K | 410 |

Note:
Fuji FPSE starts to ablate at 2.9 μJ, 500 KHz, track speed 50 mm/sec.

It has thus been shown that an ultra-fast (u-f) laser can be used to expose both analogue and CtP printing plates, independently of the wavelength the plates are sensitised to. They may be exposed to the extent that development can be carried out with a u-f laser at an energy density (fluence) of about 50-200 mJ/cm$^2$ and ablation may take place at an energy density (fluence) of about 100-300 mJ/cm$^2$. These u-f laser exposure requirements compare with traditional UV exposure needs of around 100-300 mJ/cm$^2$ for analogue plates and 100-120 mJ/cm$^2$ for CtP plates. Additionally, for ablation of commercial CtP thermal products, typically energy needs for laser diode exposure would be around 500 mJ/cm$^2$.

EXAMPLE SET 2

In this set of experiments the exposure of anodised aluminium sheets to u-f laser radiation was examined.

Freshly prepared aluminium substrate, 0.3 gauge (degreased, roughened, desmutted and anodised, without being post-anodically treated) has a contact angle with water of around 15°. Contact angle means the angle between the surface of a drop of water and the substrate, where the water comes into contact with the substrate.

If the substrate is allowed to age for four or five days the contact angle increases, until it reaches a maximum of around 70°, as shown in Table 4 below.

TABLE 4

Effect of ageing after production on contact angle of water on an aluminium substrate:

| | Time after manufacture | | | | | |
|---|---|---|---|---|---|---|
| | 5 mins | 6 hours | 24 hours | 48 hours | 96 hours | 120 hours |
| Contact angle | 15° | 20° | 30° | 50° | 65° | 70° |

On exposure of an 'aged' (>48 hours) aluminium substrate to an ultra-fast laser beam (Clark ultra-fast laser operating under the following general conditions: frequency of 1 kHz, 50μ spot size, pulse width 240 fs and with an energy density (fluence) of around 225 mJ/cm$^2$), the contact angle is reduced to ~20° i.e. the exposed area becomes more hydrophilic. The contact angle then stays fairly constant for some 12 hours and then starts to increase fairly rapidly so that some 16-18 hours after exposure, the contact angle is once more around 70° and the plate is (relatively) hydrophobic. This is shown by the results in Table 5 below.

TABLE 5

Effect of time after u-f exposure on contact angle of water on an aluminium substrate:

| | Time after exposure | | | | | |
|---|---|---|---|---|---|---|
| | 5 mins | 1 hour | 4 hours | 12 hours | 16 hours | 18 hours |
| Contact angle | 20° | 20° | 20° | 30° | 55° | 70° |

Re-exposure of the aluminium plate described above after >24 hours after the initial exposure and under laser conditions corresponding to those described above, again brings about a reduction in contact angle (i.e. an increase in hydrophilicity). This effect has been observed for at least 5 exposure/re-exposure 'cycles'.

The results indicate the potential of u-f lasers to provide a 'reversible' or 'rewriteable' printing plate system.

EXAMPLE SET 3

In this set of experiments the contact angle of water with anodised titanium sheet, and the effect of u-f radiation, was examined.

Anodised titanium sheet (having a surface of titanic) a day or more after preparation has a contact angle of around 70°. When exposed to the ultra-fast laser beam under the conditions described in Example Set 2, the contact angle reduces to 15-20° and the surface is rendered hydrophilic. After some 4-18 hours the contact angle reverts back to 70°. The results are set out in Table 6 below.

TABLE 6

Effect of time after exposure on contact angle of anodised titanium sheet:

| | Time after exposure | | | | | |
|---|---|---|---|---|---|---|
| | 5 mins | 1 hour | 2 hours | 3 hours | 4 hours | 5 hours |
| Contact angle | 10° | 10° | 20° | 30° | 55° | 70° |

Comment:

It is suggested that a contact angle in excess of 46° is good for imaged areas (hydrophobic or oleophilic) and less than 35° (ideally less than 25°) is good for background areas (non-printing, hydrophilic), in a printing plate. Thus the findings set out in Example Set 3 and Example Set 4, of the change in contact angle on aluminium and titanium sheets is of significance for printing plates. The low amounts of energy required to produce the changes in contact angle, and the accuracy and simplicity of the method using a u-f laser, show the capability for industrial application, and commercial value. The reversibility offers a prospective environmental and commercial advantage.

EXAMPLE SET 4

To further investigate the potential for the 'multiple' exposure and 'multiple' printing of an ultra-fast exposed aluminium plate, the following experiment was conducted. A grained and anodised aluminium plate ('standard' treatments as identified above) was exposed (exposure 1) using an ultra-fast laser (Clark ultra-fast laser operating under the following general conditions: frequency of 1 kHz, 50 μm spot size, pulse width 240 femtoseconds and fluence of 225 mJ/cm$^2$). The exposure target image comprised two '50% tint' chequers and a non-printing image 'moat' around the chequer patterns (this, to prevent the oleophilic surrounding areas 'swamping' the non-printing image areas and masking any print differential). A simple offset press test (print test 1) was conducted on this as-imaged plate on a Heidelberg GTO press. Print testing took place within two and a half hours of the ultra-fast laser exposure being completed. After adjustment of ink water balance, 250 good quality prints were obtained, before printing was terminated.

The plate was then removed from the press, excess ink was removed from the plate and the plate was 'reverted' artificially to its hydrophobic state by heating at 150° C. for one hour followed by a 'relaxation' period of 30 minutes under ambient conditions. The plate was then subjected to the same exposure conditions (exposure 2) as in exposure 1 above and again placed on the printing press. After ink water balance adjustments, good quality prints (print test 2) were again obtained. FIG. 1 is a photograph showing the print quality after 250 prints (from print test 2). It is clear from the photograph that the printed image is of good quality and that the print does not show any evidence of the original (first) exposure; suggesting that the first exposure image completely reverted to its original hydrophobic state, and that re-use as a printing plate—involving re-exposure of a further image and a consequential stage of printing that further image—is entirely possible by way of this invention.

EXAMPLE SET 5

Experiments were conducted with a nanosecond pulse laser to see if the same phenomenon was also apparent at longer laser radiation pulses (nanoseconds).

Tests on a pulsed 10 W Ytterbium fibre nanosecond laser (IPG Photonics) using a Pryor (Yb) Pulsed Fibre Laser YF20 system were conducted. General exposure conditions were as follows:

Average power=10-20 W
Frequency=20-100 kHz
Wavelength=1064 nm
Spot size=60μ
Pulse width=100 nanoseconds
Pulse energy=1 mJ The exposure tests were undertaken on grained and anodised aluminium ('standard' conditions, no post-anodic treatment). Contact angle and reversion times are detailed below.

| | Contact angle (°) | | | |
|---|---|---|---|---|
| Pulse frequency (kHz) | On exposure | After 2 hours | After 4 hours | After 9 hours |
| 46 | <15 | 20 | 20 | >70 |
| 60 | <15 | 40 | 70 | >70 |

It was observed that on nanosecond exposure the substrate, in exposed areas, became hydrophilic (as determined by contact angle measurement) and then over a period of time and dependent upon the pulse frequency, the exposed areas of substrate reverted to their hydrophobic state. The observations made, suggest that nanosecond laser exposure of alumina substrate could form the basis for generating a lithographic printing surface.

EXAMPLE SET 6

Simple experiments with stainless steel (grade 304-18% Cr, 8% Ni) have shown that its typically hydrophobic surface (contact angle ~70°) can be rendered hydrophilic (contact angle ~15°) by exposure with a nanosecond laser (Pryor (Yb) Pulsed Fibre Laser YF20) which operates at a wavelength of 1064 nm and an average power of 20 W. The specific exposure conditions employed were as follows: pulse width 100 nS, pulse energy 1 mJ, spot size 60μ and a frequency of 20 kHz. The thus-exposed surface then, over a period of time (4 to 5 hours), reverted to a hydrophobic state (contact angle ~70°). Subsequent re-exposure to investigate if a potential 're-writeable' capability also exists for stainless steel was carried out. Re-exposure with for example, a Clark femtosecond laser operating under the following conditions: wavelength of 775 nm, 30 μm spot size, pulse width 180 fs, resulted in a hydrophilic surface again being generated (contact angle <20°). 'Re-writeability' (and hence re-use as a printing plate) with stainless steel thus appears to be viable.

In this case the image layer is believed to be chromium oxide which naturally forms a passive protective layer on the surface of the stainless steel.

EXAMPLE SET 7

A number of other metals (metallic compounds) have been examined in preliminary tests. The following general ultra-fast laser conditions were employed: HiQ picosecond laser operating at a wavelength of 355 nm, a pulse width of 10 ps, a pulse energy of 7 μJ, a spot size of 15μ and a frequency of 5 kHz. All metallic samples were hydrophobic prior to exposure.

Initial exposures were undertaken, observations made and recorded in the table below. Following the initial exposures, the samples were artificially 'reverted' to their hydrophobic state by heating for 1 hour at 150° C. followed by a 'relaxation' period of 30 minutes under ambient conditions before a second exposure was undertaken. The observations are recorded below.

| Metal/metal oxide | Observation on initial Exposure - hydrophilic? | Observation on re-exposure (after reversion) - hydrophilic? |
|---|---|---|
| Copper (has copper oxide surface) | yes | yes |
| Brass (has zinc oxide surface) | yes | yes |
| Silver (tarnished - thought to be silver sulphide surface) | yes | yes |

The invention claimed is:

1. A method of preparing a printing form precursor for printing, the method comprising the step of applying electromagnetic radiation having a pulse duration of not greater than $1\times10^{-6}$ seconds and a fluence of at least 100 mJ/cm$^2$, in an imagewise manner, to an imageable surface of the printing form precursor,
wherein the imageable surface is aluminium oxide.

2. A method as claimed in claim 1, wherein an average frequency of the pulses is at least 100 pulses per second.

3. The method of claim 1, wherein the pulses of electromagnetic radiation are of duration not greater than $1\times10^{-7}$ seconds.

4. A method as claimed in claim 1, wherein an incubation number N in the method is 1 or a larger number up to 10.

5. A method as claimed in claim 1, wherein a profile of a laser beam applying the electromagnetic radiation is Gaussian, square or rectangular.

6. A method as claimed in claim 1, wherein the method employs, as an imaging device, a nanosecond laser, a femtosecond laser, or a picosecond laser.

7. A printing form having an imageable surface subjected to pulses of electromagnetic radiation of duration not greater than $1\times10^{-6}$ seconds and a fluence of at least 100 mJ/cm$^2$, with the result that selected portions are ink-accepting and the reciprocal portions are not ink-accepting,
wherein the imageable surface is aluminium oxide.

8. The printing form precursor of claim 7, wherein the pulses of electromagnetic radiation are of duration not greater than $1\times10^{-7}$ seconds.

* * * * *